(12) United States Patent
Ishibashi

(10) Patent No.: US 6,709,132 B2
(45) Date of Patent: Mar. 23, 2004

(54) LED BULB

(75) Inventor: Kazuo Ishibashi, Fukuoka (JP)

(73) Assignee: ATEX Co., Ltd., Fukuoka-ken (JP)

( * ) Notice: Subject to any disclaimer, the term of this patent is extended or adjusted under 35 U.S.C. 154(b) by 0 days.

(21) Appl. No.: 10/147,119

(22) Filed: May 16, 2002

(65) Prior Publication Data

US 2003/0031015 A1 Feb. 13, 2003

(30) Foreign Application Priority Data

Aug. 13, 2001 (JP) ......................................... 2001-245750

(51) Int. Cl.[7] ............................................... F21V 21/00
(52) U.S. Cl. ........................ 362/249; 362/800; 362/363
(58) Field of Search ................................. 362/236, 240, 362/244, 246, 249, 250, 800, 806, 418, 363

(56) References Cited

U.S. PATENT DOCUMENTS

| | | | |
|---|---|---|---|
| 5,585,783 A | * | 12/1996 | Hall ........................... 362/800 |
| 5,806,965 A | * | 9/1998 | Deese ......................... 362/249 |
| 6,070,991 A | * | 6/2000 | Rumpel ....................... 362/806 |

* cited by examiner

*Primary Examiner*—Y. My Quach-Lee
(74) *Attorney, Agent, or Firm*—Jordan & Hamburg LLP

(57) ABSTRACT

Provided is an LED bulb with a higher distribution of luminous intensity which is close to those of tungsten bulbs, in which the problem in directivity of the prior art LED bulbs has been solved while maintaining the advantages of an LED, that is, a long life and an energy saving characteristic. The LED bulb comprises a printed circuit board 5 which is flat when developed and is bendable to form a cage, a plurality of LEDs 6 which are disposed on the printed circuit board 5, and a transparent or semi-transparent cover 2 which encloses the printed circuit board 5 formed into the cage. The printed circuit board 5 may have a plurality of belt-like branches 5a which extend in radial directions from the center of the printed circuit board 5. The LED bulb may further comprise a power unit housing 8 for containing a power unit which supplies electric current to each of the LEDs 6.

13 Claims, 3 Drawing Sheets ns a light bulb using a
LED BULB

BACKGROUND OF THE INVENTION

The present invention relates to a light bulb using a plurality of LEDs as light sources.

As conventional lights, light bulbs using tungsten as a filament and fluorescent lamps in which a fluorescent substance emits light by electric discharge in a gas have been generally used. However, since these lights utilize light emission by resistance heat or high-voltage discharge, a large amount of energy is lost as heat energy, leading to lower efficiency in light emission. Therefore, they do not contribute to saving energy. In addition, as a matter of course, filaments break, electrodes are consumed, and sealed gases deteriorate, which shortens product life. Moreover, fluorescent lamps pollute the environment when disposed of because of the toxic substances they contain. Thus, conventional lights have various problems.

On the other hand, LEDs have made rapid improvement in performance. In addition to the development of the white LED, which is indispensable for lighting, LEDs can now emit light sufficiently luminescent for lighting in terms of brightness. Accordingly, a great deal of research is being conducted on the application of LEDs to lighting.

Nevertheless, the disadvantages of the LED are its narrower illuminating angle and difficulty in radiating light uniformly in all directions contrary to the conventional tungsten bulb. As a bulb which emits light only in one direction, a bulb 10 in FIG. 3 in which a reflector 11 is provided around LEDs 12 has been developed, which, however, cannot be applied as a bulb having no directivity.

In view of the above, one system developed is a bulb 20 shown in FIG. 4, having a spherical plastic portion 23 in a form of aggregation of fish-eye lens or polyhedron which covers the front of the emitting portion of LEDs 22 horizontally arranged on a substrate 21, thereby diffusing light in all directions utilizing refraction of light on the spherical plastic portion 23.

However, in the system shown in FIG. 4, since the number of the LEDs 22 packaged on the substrate 21 is limited, lights having a higher luminance cannot be obtained. Furthermore, the distance between the LEDs and each lens varies depending on the position, thus causing uneven brightness. Therefore, if a plurality of LEDs having a very narrow illuminating angle are disposed on a flat substrate, the illuminating angle of the total system cannot be improved. Even a structure utilizing reflection or refraction of light only enables a very dark bulb with low efficiency.

An object of the present invention is to provide an LED bulb with a higher distribution of luminous intensity which is close to those of tungsten bulbs, in which the problem in directivity of the prior art LED bulbs has been solved while maintaining the advantages of an LED, that is, a long life and an energy saving characteristic.

SUMMARY OF THE INVENTION

In order to solve the above problems, an LED bulb of the present invention comprises a printed circuit board which is flat when developed and is bendable to form a cage, a plurality of LEDs which are disposed on the printed circuit board, and a transparent or semi-transparent cover which encloses the printed circuit board formed into the cage.

The printed circuit board may have a plurality of belt-like branches which extend in radial directions from the center of the printed circuit board.

According to the present invention, by bending a printed circuit board with a plurality of LEDs disposed on the surface thereof to form a cage, thereby providing a light source of a bulb in a small spherical form, direct light of the LEDs can radiate in various directions, which enables light emission in all directions.

By providing a printed circuit board in a shape having a plurality of belt-like branches which extend in radial directions from the center, the board can be manufactured from a flat board and formed into a cage by bending.

If the power source is commercial alternate current, a power source unit for lighting the LEDs is housed inside the bulb, which enables the LED bulb to be used in a manner similar to conventional incandescent lamps.

DESCRIPTION OF THE PREFERRED EMBODIMENT

Figure 1:
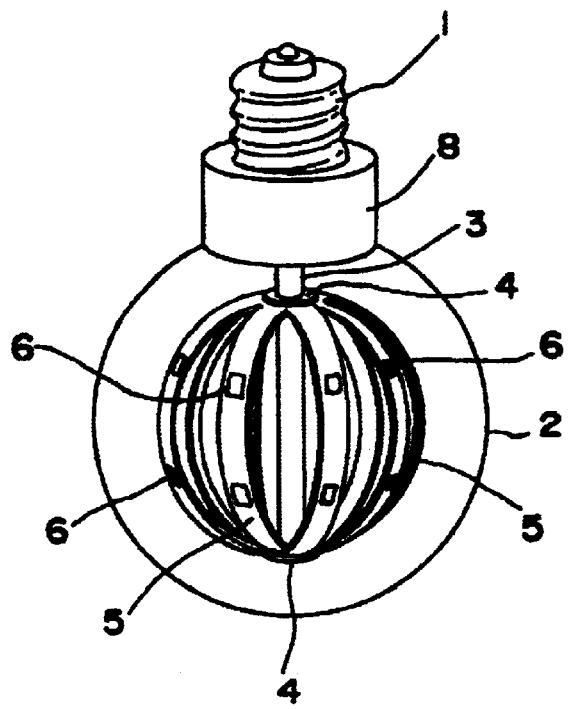
FIG. 1 is a perspective view showing an embodiment of the present invention.
Figure 2:
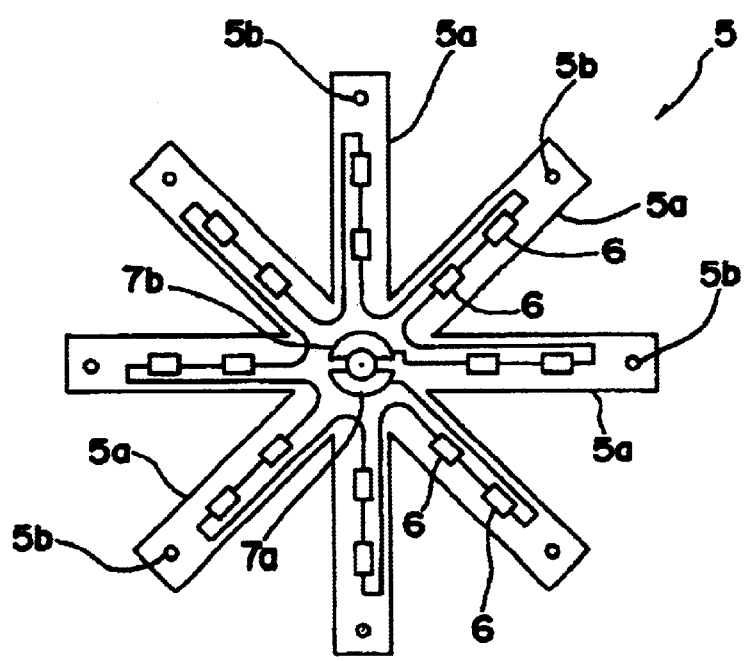
FIG. 2 is a development of a printed circuit board according to the embodiment of the present invention.
Figure 3:
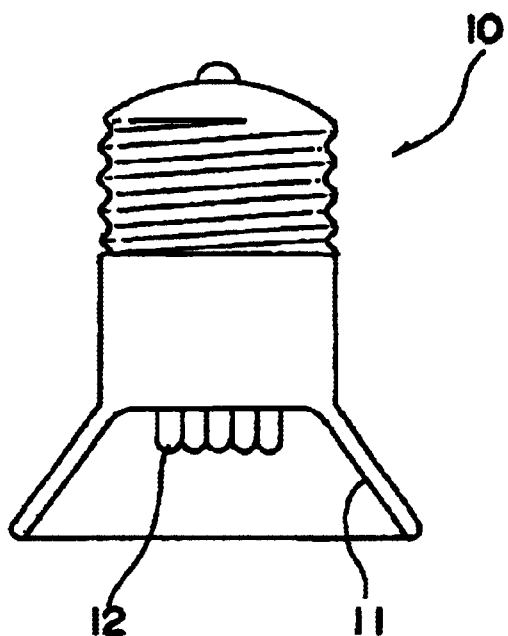
FIG. 3 is a partly sectional view showing a prior art LED bulb with a reflector.
Figure 4:
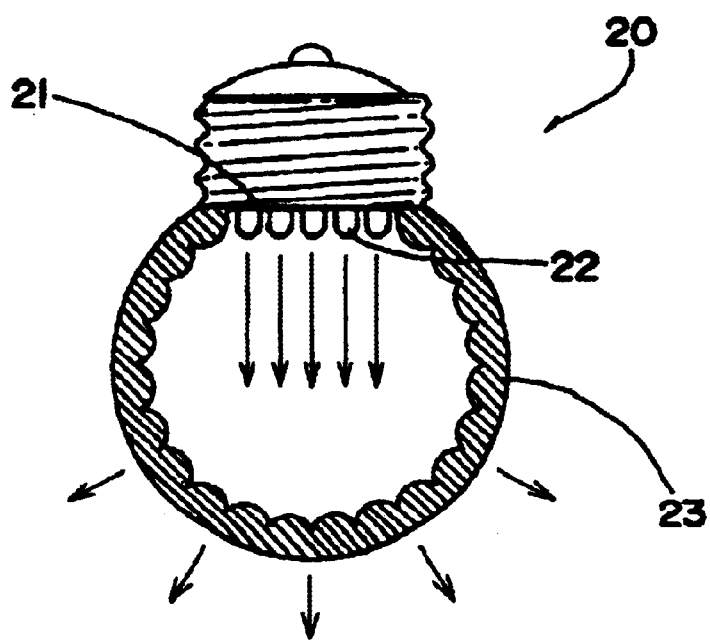
FIG. 4 is a partly sectional view showing another prior art LED bulb provided with lenses.

Referring to FIGS. 1 and 2, an embodiment of the present invention is described below.

FIG. 1 is a perspective view showing an embodiment of the present invention; and FIG. 2 is a development of a printed circuit board according to the embodiment of the present invention.

In these figures, 1 denotes a cap which is attachable to an ordinary bulb socket; 2 denotes a cover; 3 denotes a supporting rod; 4 denotes a stop; 5 denotes a printed circuit board; 5a denotes a belt-like branch; 5b denotes a connecting hole; 6 denotes an LED chip; 7a and 7b denote electrode units; and 8 denotes a power source housing.

As shown in the development of FIG. 2, the printed circuit board 5 has a plurality of the belt-like branches 5a extending in radial directions from the center, thereby forming a shape like a star. The printed circuit board 5 has a structure in which a wiring pattern formed by punching or etching a conductive material is sandwiched and held by thin flexible films made of an insulating material such as polyimide resin. The insulating film on one side of the wiring pattern has openings so that the portions to be soldered on the wiring pattern are exposed. On the printed circuit board 5, a plurality of the LED chips 6 are packaged on the wiring pattern by soldering or the like. The LED chips 6 are usually connected to the electrode units 7a and 7b in a series. The recent progress in miniaturizing techniques has enabled a smaller size of the LED chips 6 such as 1.6×1.0 mm, which is small enough to be mounted on the belt-like branches 5a having a width of 3 mm, for example.

The distal ends of the belt-like branches 5a of the star-shaped printed circuit board 5 are put together to superimpose at the connecting holes 5b, through which the supporting rod is passed, and fixed by the stops 4. Thus, the printed circuit board 5 has a shape of a cage as shown in FIG. 1.

Electricity applied to each of the LED chips 6 is, if the power supplied from the cap 1 is commercial alternate current of 100 V, converted to low voltage direct current by a power circuit (not shown) housed in the power source housing 8, and the current is supplied to the electrode units 7a and 7b of the printed circuit board 5 through the supporting rod 3.

The cover 2 may comprise a transparent or semi-transparent plastic material. If the cover 2 is transparent, each one of a plurality of LED chips can be seen as a separate light source. On the other hand, if the cover 2 is semi-transparent or milky white, the whole surface of the cover 2 appears to emit light due to the effect of diffused reflection. Although the inside of the cover 2 need not be vacuum like an incandescent lamp, it is preferable that the cover 2 is filled with dry air or an inert nitrogen gas to prevent dust or moisture from entering the inside.

Preferably, the power source housing 8 may be made of a colored plastic material so that the inner circuit cannot be seen. The circuit may be molded with a highly heat-conductive material such as silicone gum, thereby diffusing heat generated from the circuit.

In the LED bulb described above, similar to conventional bulbs, by attaching the cap 1 to a socket, direct current is supplied to the electrode units 7a and 7b on the printed circuit board 5 from the power circuit housed in the power source housing 8 through the supporting rod 3, thereby lighting each of the LED chips 6. As each of the LED chips 6 is substantially uniformly arranged on the surface of the printed circuit board 5 formed in a cage, the light source is made to be a sphere, emitting light in all directions from the cover 2.

The color of the LED chips 6 can be selected depending on the purposes. As a substitute for a conventional incandescent lamp, a white LED is used. On the other hand, it is possible to use LEDs with either of or a combination of colors such as red, green, blue, or orange. It is further possible to use the cover 2 with a color in combination with colored LEDs to create light of additional colors.

Figure 5:
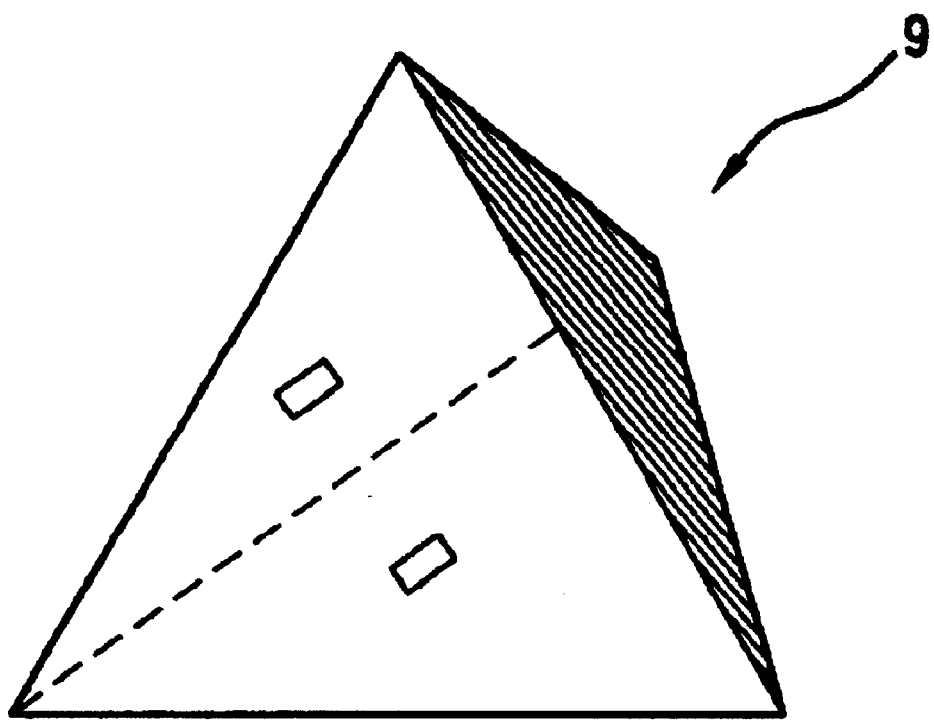
FIG. 5 shows an equilateral polyhedron.

In the above embodiment, the printed circuit board 5 has a development having a star shape as shown in FIG. 2. However, the shape should only be flat when manufactured and become a cage when bent, and may be a spiral like an extended apple skin peeled rotationally or an equilateral polyhedron 9 as shown in FIG. 5.

The power source supplied from the cap 1 has been described above in the case of 100 V commercial alternate current. When the bulb is used by attaching the cap 1 to a socket of direct current of about 12 V, the power circuit housed in the bulb is not required, and therefore it is not necessary to provide the power source housing 8 shown in FIG. 1.

It is further possible to draw out a lead wire by which the bulb is connected to a power source outside without using the cap 1.

While particular embodiments of the present invention have been shown and described, numerous variations and alternate embodiments will occur to those skilled in the art. Accordingly, it is intended that the invention be limited only by the appended claims.

What is claimed is:

1. An LED bulb comprising:
   a printed circuit board which is flat and has a plurality of belt like branches which extend in a radial direction from a center of the printed circuit board when developed as is bendable to form a cage by putting together distal ends of the belt like branches at one position:
   a plurality of LED's which are disposed on each of the belt like branches of the printed circuit board; and a transparent or semi-transparent cover which encloses the printed circuit board formed into the cage.

2. The LED bulb according to claim 1, further comprising:
   a supporting rod;
   a power supply unit; and
   a housing containing said power supply unit which supplies electric current to each of the LEDs disposed on the printed circuit board through said supporting rod.

3. A structure for LEDs comprising:
   a bendable printed circuit board having a center portion and having a plurality of arms extending radially from the center portion;
   each arm of said plurality of arms having a first end extending from said center portion and a second end at a location opposite said center portion;
   said plurality of arms of said bendable circuit board being bent, forming a cage and joining at said second end of each arm of said plurality of arms; and
   a plurality of LEDs disposed on at least one arm of said plurality of arms.

4. A structure for LEDs according to claim 3, further comprising:
   a supporting rod;
   a power unit;
   said supporting rod extending from the second end of each arm of said plurality of arms through said center portion of said bendable printed circuit board; and
   said power supply unit supplying power to said bendable printed circuit board through said supporting rod.

5. A structure for LEDs according to claim 4 further comprising one of a transparent or semitransparent cover enclosing said bendable printed circuit board.

6. A structure for LEDs according to claim 4, wherein said cover is semitransparent and milky-white.

7. A structure for LEDs according to claim 4, wherein said cover is filled with one of dry air or nitrogen gas.

8. A structure for LEDs comprising:
   a bendable printed circuit board having a center portion and having a plurality of arms extending from the center portion;
   each arm of said plurality of arms having a first end extending from said center portion and a second end;
   said plurality of arms of said bendable circuit board being bent, forming a cage and joining at said second end of each arm of said plurality of arms; and
   a plurality of LEDs disposed on at least one arm of said plurality of arms.

9. A structure for LEDs according to claim 8, further comprising:
   a supporting rod;
   a power unit;
   said supporting rod extending from the second end of each arm of said plurality of arms through said center portion of said bendable printed circuit board; and
   said power supply unit supplying power to said bendable printed circuit board through said supporting rod.

10. A structure for LEDs according to claim 9 further comprising one of a transparent or semitransparent cover enclosing said bendable printed circuit board.

11. A structure for LEDs according to claim 10, wherein said cover is semitransparent and milky-white.

12. A structure for LEDs according to claim 10, wherein said cover is filled with one of dry air or nitrogen gas.

13. A structure for LEDs according to claim 8 wherein said cage is an equilateral polyhedron.

* * * * *